(12) United States Patent
Wakui et al.

(10) Patent No.: US 10,217,907 B2
(45) Date of Patent: Feb. 26, 2019

(54) METHOD OF PRODUCING NITRIDE FLUORESCENT MATERIAL, NITRIDE FLUORESCENT MATERIAL, AND LIGHT EMITTING DEVICE USING THE SAME

(71) Applicant: NICHIA CORPORATION, Anan-shi, Tokushima (JP)

(72) Inventors: Sadakazu Wakui, Tokushima (JP); Tadayoshi Yanagihara, Tokushima (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/440,479

(22) Filed: Feb. 23, 2017

(65) Prior Publication Data

US 2017/0250320 A1    Aug. 31, 2017

(30) Foreign Application Priority Data

Feb. 29, 2016 (JP) ................................. 2016-037616
Sep. 30, 2016 (JP) ................................. 2016-193960

(51) Int. Cl.
*H01L 33/50* (2010.01)
*C09K 11/08* (2006.01)
*C09K 11/77* (2006.01)

(52) U.S. Cl.
CPC ........ *H01L 33/502* (2013.01); *C09K 11/0883* (2013.01); *C09K 11/7734* (2013.01);
(Continued)

(58) Field of Classification Search
CPC .......... H01L 33/502; H01L 2933/0041; C09K 11/7721; C09K 11/7734; C09K 11/7749
See application file for complete search history.

(56) References Cited

U.S. PATENT DOCUMENTS

| 6,242,043 B1 | 6/2001 | Lipp |
| 6,346,326 B1 | 2/2002 | Yocom |

(Continued)

FOREIGN PATENT DOCUMENTS

| JP | H10-259374 | 9/1998 |
| JP | 2001-200249 A | 7/2001 |

(Continued)

OTHER PUBLICATIONS

Philipp Pust et al., "Narrow-band red-emitting Sr[LiAl3N4]:Eu2+ as a next-generation LED-phosphor material," Nature Materials, NMAT4012, vol. Sep. 13, 2014. 17 pages.

*Primary Examiner* — David Spalla
(74) *Attorney, Agent, or Firm* — Hunton Andrews Kurth LLP

(57) ABSTRACT

A method of producing a nitride fluorescent material is provided. The nitride fluorescent material undergoes less change in chromaticity under a high-temperature and high-humidity condition and are excellent in durability. The nitride fluorescent material has a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; and N. The method includes: preparing a calcined product having the composition, bringing the calcined product in contact with a fluorine-containing substance, and heat-treating the calcined product at a temperature of 200° C. or more and 500° C. or less. A light emitting device using the nitride fluorescent material is also provided.

8 Claims, 9 Drawing Sheets

(52) U.S. Cl.
CPC .............. *H01L 2224/48091* (2013.01); *H01L 2224/48247* (2013.01); *H01L 2224/48257* (2013.01); *H01L 2224/73265* (2013.01); *H01L 2924/181* (2013.01)

(56) References Cited

U.S. PATENT DOCUMENTS

| | | | |
|---|---|---|---|
| 2013/0094186 A1* | 4/2013 | Sun | ................ C09K 11/025 362/97.3 |
| 2014/0054634 A1* | 2/2014 | Fukuda | .............. C09K 11/7734 257/98 |
| 2015/0123155 A1 | 5/2015 | Schmidt et al. | |
| 2016/0312118 A1* | 10/2016 | Fiedler | ............... C09K 11/7728 |

FOREIGN PATENT DOCUMENTS

| | | | |
|---|---|---|---|
| JP | 2002-527570 A | 8/2002 |
| JP | 2002-539925 A | 11/2002 |
| JP | 2009-132916 A | 6/2009 |
| JP | 2015-526532 A | 9/2015 |
| WO | 2012-070565 A1 | 5/2012 |

\* cited by examiner

METHOD OF PRODUCING NITRIDE FLUORESCENT MATERIAL, NITRIDE FLUORESCENT MATERIAL, AND LIGHT EMITTING DEVICE USING THE SAME

CROSS-REFERENCE TO RELATED APPLICATIONS

This application claims the benefit of Japanese Patent Application No. 2016-037616, filed on Feb. 29, 2016 and Japanese Patent Application No. 2016-193960, filed on Sep. 30, 2016, the disclosures of which are hereby incorporated by reference in their entirety.

BACKGROUND

Technical Field

The present disclosure relates to a method of producing a nitride fluorescent material, a nitride fluorescent material, and a light emitting device using the same.

Description of Related Art

A light emitting device formed by combining a light emitting diode (hereinafter may be referred to as "LED") and a fluorescent material has been increasingly applied as lighting apparatuses and backlight for liquid crystal displays, etc. For example, in the case where the light emitting device is used in a liquid crystal display device, a fluorescent material of narrow half bandwidth is desired to provide a wider range of color reproducibility.

Examples of such a fluorescent material include a red light-emitting phosphor of $SrLiAl_3N_4$:Eu (hereinafter may be referred to as a "SLAN phosphor"). For example, Patent Literature 1 (PTL1) and Non-Patent Literature 1 (NPL1) disclose SLAN phosphors having a narrow half bandwidth of 70 nm or less and having a peak fluorescence wavelength near 650 nm.

As disclosed in NPL1, a SLAN phosphor is, for example, produced such that powders of raw materials including lithium aluminum hydride ($LiAlH_4$), aluminum nitride (AlN), strontium hydride ($SrH_2$), and europium fluoride ($EuF_3$) are weighed in a stoichiometric ratio so that Eu is 0.4 mol % and mixed. The mixture is placed in a crucible and calcined in a mixed gas atmosphere of hydrogen and nitrogen under atmospheric pressure at a temperature of 1000° C. for two hours.

CITATION LIST

Patent Literature

PTL1: Japanese Laid-open Patent Publication No. 2015-526532

Non Patent Literature

NPL1: Philipp Pust et al., "Narrow-band red-emitting $Sr[LiAl_3N_4]$:$Eu^{2+}$ as a next-generation LED-phosphor material," Nature Materials, NMAT4012, vol. 13, September 2014.

SUMMARY

However, it has been known that the SLAN phosphor tends to deteriorate with oxygen, heat, water, etc., and there is a need for the durability light emitting devices using the SLAN fluorescent to be further improved. An object of the present disclosure is to provide a method of producing a nitride fluorescent material that is capable of providing a light emitting device having excellent durability, a nitride fluorescent material, and a light emitting device using the same.

Specific examples for achieving the objects will be described below. Certain embodiments of the present invention include configurations illustrated below. In a first embodiment, a method of producing a nitride fluorescent material is described. The nitride fluorescent material has a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; and N. The method includes: preparing a calcined product having the composition; and bringing the calcined product in contact with a fluorine-containing substance and heat-treating the calcined product at a temperature in a range of 200° C. or more and 500° C. or less.

In a second embodiment, a nitride fluorescent material is described. The nitride fluorescent material contains a fluorescent material core having a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; N; and Si depending on necessity, and on a surface of the fluorescent material core, a layer containing a compound containing fluorine.

In a third embodiment, a light emitting device containing the nitride fluorescent material and an excitation light source is described.

According to embodiments of the present disclosure, a method for producing a nitride fluorescent material that is capable of providing a light emitting device having excellent durability, a nitride fluorescent material, and a light emitting device can be provided.

DETAILED DESCRIPTION

Figure 1:
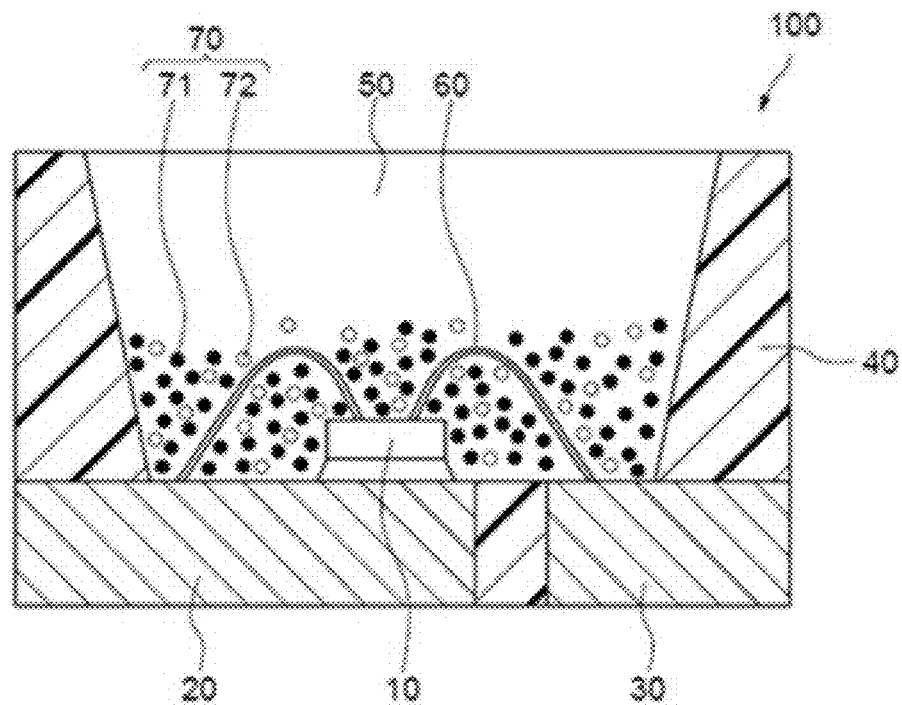
FIG. 1 is a schematic cross sectional view showing an example of a light emitting device.

A method of producing a nitride fluorescent material, the nitride fluorescent material, and the light emitting device according to the present disclosure will be described below. However, the embodiments shown below exemplify the method of producing a nitride fluorescent material for practicing the technical concept of the present invention, and the scope of the present invention is not limited to the method of producing a nitride fluorescent material shown below. In the specification, the relationship between the color name and the chromaticity coordinate, the relationship between the wavelength range of light and the color name of monochromic light, and the like are in accordance with JIS Z8110. In the case where a composition contains plural substances that correspond to one component, the content of the component in the composition means the total amount of the plural substances contained in the composition, unless otherwise indicated.

Method for Producing Nitride Fluorescent Material

The method of producing a nitride fluorescent material according to one embodiment is a method of producing a nitride fluorescent material having a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; and N, and the method includes: preparing a calcined product having the composition; and bringing the calcined product in contact with a fluorine-containing substance and heat-treating the calcined product at a temperature in a range of 200° C. or more and 500° C. or less.

Preparing Calcined Product

The calcined product prepared in the production method of the embodiment is not particularly limited, as long as the calcined product has a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; and N. The composition of the calcined product may contain Si instead of a part of Al, may contain O through oxidation of the surface, and may contain O instead of a part of N.

The calcined product preferably has a composition represented by the following formula (I). In the composition represented by the formula (I), a part of N may be replaced by O through oxidation of the surface.

$$M^a{}_v M^b{}_w M^c{}_x Al_{3-y} Si_y N_z \quad (I)$$

wherein $M^a$ represents at least one element selected from the group consisting of Ca, Sr, Ba, and Mg; $M^b$ represents at least one element selected from the group consisting of Li, Na, and K; $M^c$ represents at least one element selected from the group consisting of Eu, Ce, Tb, and Mn; and v, w, x, y, and z each are numbers satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$, respectively.

In the formula (I), $M^a$ preferably contains at least one of Ca and Sr from the standpoint of providing a high light emission intensity. In the case where $M^a$ contains at least one of Ca and Sr, the total molar ratio of Ca and Sr contained in $M^a$ may be, for example, 85% by mol or more, and preferably 90% by mol or more.

$M^b$ preferably contains at least Li from the standpoint of the stability of the crystal structure. In the case where $M^b$ contains Li, the molar ratio of Li in $M^b$ may be, for example, 80% by mol or more, and preferably 90% by mol or more.

In the formula (I), v, w, x, y, and z are not particularly limited, as long as these numbers satisfy the aforementioned numerical value ranges. The parameter v is preferably 0.80 or more and 1.05 or less, and more preferably 0.90 or more and 1.03 or less, from the standpoint of the stability of the crystal structure. The parameter x is the activation amount of at least one element selected from the group consisting of Eu, Ce, Tb, and Mn, and may be selected appropriately to achieve the target characteristics. The parameter x preferably satisfies $0.001 < x \leq 0.020$, and more preferably satisfies $0.002 \leq x \leq 0.015$.

The calcined product can be obtained, for example, in such a manner that materials are mixed to have a composition containing at least one element selected from the group consisting of Ca, Sr, Ba, and Mg (i.e., the $M^a$ element), at least one element selected from the group consisting of Li, Na, and K (i.e., the $M^b$ element), at least one element selected from the group consisting of Eu, Ce, Tb, and Mn (i.e., the $M^c$ element), Al, and N, and containing Si depending on necessity, and the resulting material mixture is fired in an atmosphere containing nitrogen gas at a temperature in a range of 1,000° C. or more and 1,300° C. or less and a pressure in a range of 0.2 MPa or more and 200 MPa or less.

By firing the material mixture in a pressurized atmosphere containing nitrogen gas under a prescribed temperature, a calcined product that has the target composition and is used for a nitride fluorescent material having a high light emission intensity can be efficiently produced.

The material mixture used in the calcined product may contain other materials, as long as the material mixture is capable of providing a calcined product having a composition containing at least one element selected from the group consisting of Ca, Sr, Ba, and Mg, at least one element selected from the group consisting of Li, Na, and K, at least one element selected from the group consisting of Eu, Ce, Tb, and Mn, Al, and N, and containing Si depending on necessity. For example, the material mixture may contain at least one selected from the group consisting of elemental substances and metal compounds of the metal constituting the composition containing at least one element selected from the group consisting of Ca, Sr, Ba, and Mg, at least one element selected from the group consisting of Li, Na, and K, at least one element selected from the group consisting of Eu, Ce, Tb, and Mn, Al, N, and Si depending on necessity. Examples of the metal compounds include a hydride, a nitride, a fluoride, an oxide, a carbonate, and a chloride. The metal compound is preferably at least one elected from the group consisting of a hydride, a nitride, and a fluoride, from the standpoint of the enhancement of the light emission characteristics. In the case where the material mixture contains an oxide, a carbonate, a chloride, and the like, the content thereof is preferably 5% by mass or less, and more preferably 1% by mass or less, based on the material mixture. In the case where the content thereof exceeds the value, defects tend to be formed in the crystal, and there is a possibility that the light emission intensity is decreased, and the half bandwidth is increased.

The material mixture preferably contains a metal compound containing at least one element selected from the group consisting of Ca, Sr, Ba, and Mg, a metal compound containing at least one element selected from the group consisting of Li, Na, and K, and at least one selected from the group consisting of a metal compound containing Al and a metal compound containing Eu. The material mixture may contain a metal compound containing Si depending on necessity.

Examples of the metal compound containing at least one element selected from the group consisting of Ca, Sr, Ba, and Mg (i.e., the $M^a$ element in the formula (I)) (which may be hereinafter referred to as a "first metal compound") include $SrN_2$, $SrN$, $Sr_3N_2$, $SrH_2$, $SrF_2$, $Ca_3N_2$, $CaH_2$, and CaF$_2$, and at least one selected from the group consisting of these compounds is preferably used.

The first metal compound preferably contains at least one of Ca and Sr. In the case where the first metal compound contains Sr, a part of Sr may be replaced by Ca, Mg, Ba, and other elements. In the case where the first metal compound contains Ca, a part of Ca may be replaced by Sr, Mg, Ba, and other elements. According to the constitution, the peak light emission wavelength of the nitride florescent material can be adjusted. In the case where the first metal compound contains Ca, the first metal compound may further contain Li, Na, K, B, Al, and other elements.

The first metal compound such as an imide compound and an amide compound may also be used. The first metal compound may be used solely or as a combination of two or more kinds thereof.

The metal compound containing at least one element selected from the group consisting of Li, Na, and K (i.e., the $M^b$ element in the formula (I)) (which may be hereinafter referred to as a "second metal compound") preferably contains at least Li, and at least one of a nitride and a hydride of Li is more preferred therefor. In the case where the second metal compound contains Li, a part of Li may be replaced by Na, K, and other elements, and the second metal compound may contain the other metal elements constituting the nitride fluorescent material.

Examples of the second metal compound containing Li include Li$_3$N, LiN$_3$, LiH, and LiAlH$_4$, and at least one selected from the group consisting of these compounds is preferably used. The second metal compound may be used solely or as a combination of two or more kinds thereof.

The metal compound containing Al (which may be hereinafter referred to as a "third metal compound") may be a metal compound containing substantially only Al, may be a metal compound containing Al, a part of which is replaced by a metal element selected from the group consisting of Ga and In, which are Group 13 elements, and V, Cr, Co, and other elements to the Period 4 transition elements in the periodic table, and may be a metal compound containing Al and a metal element constituting the nitride fluorescent material, such as Li.

Examples of the third metal compound include AlN, AlH$_3$, AlF$_3$, and LiAlH$_4$, and at least one selected from the group consisting of these compounds is preferably used. The third metal compound may be used solely or as a combination of two or more kinds thereof.

In the case where Si is contained in the composition of the calcined product as a part of Al, a metal compound containing Si as a metal element is preferably used. Examples of the metal compound containing Si include SiO$_2$, Si$_3$N$_4$, SiC, and SiCl$_4$, and at least one selected from the group consisting of these compounds is preferably used. The metal compound containing Si may be used solely or as a combination of two or more kinds thereof.

The metal compound containing at least one element selected from the group consisting of Eu, Ce, Tb, and Mn (i.e., the $M^c$ element in the formula (I)) (which may be hereinafter referred to as a "fourth metal compound") contains Eu, Ce, Tb, or Mn as an activation agent.

In the case where the fourth metal compound contains Eu, a part of Eu may be replaced by Sc, Y, La, Ce, Pr, Nd, Sm, Gd, Tb, Dy, Ho, Er, Tm, Yb, Lu, and the like. In the case where a part of Eu is replaced by the other elements, it is considered that the other elements function as a co-activation agent. By co-activating the nitride fluorescent material, the light emission characteristics thereof can be adjusted. In the case where a mixture containing necessarily Eu is used as the nitride fluorescent material, the mixing ratio thereof may be changed depending on purposes. While europium mainly has divalent and trivalent energy levels, the calcined product used in the nitride fluorescent material according to the embodiment uses at least Eu$^{2+}$ as an activation agent.

Examples of the fourth metal compound include Eu$_2$O$_3$, EuN, and EuF$_3$, and at least one selected from the group consisting of these compounds is preferably used. The calcined product used in the production method according to the embodiment contains divalent Eu as a center of light emission, and the material mixture may be constituted by using a metal compound containing trivalent Eu since divalent Eu tends to be oxidized.

The material mixture may contain, in addition to the aforementioned metal elemental substances and metal compounds, an additional metal element other than these. The additional metal element may constitute the material mixture generally in the form of an oxide and a hydroxide, but is not limited thereto, and the additional metal element may be in the form of a metal elemental substance, a nitride, an imide compound, an amide compound, and other inorganic salts, and may be contained in the material mixture in advance.

The material mixture may contain a flux. In the case where the material mixture contains a flux, the reaction of the materials is further accelerated, and the solid phase reaction proceeds more uniformly. Accordingly, a calcined product having a large particle diameter for providing a nitride fluorescent material excellent in light emission characteristics can be produced. This is because, for example, the heat treatment for providing the calcined product is performed at 1,000° C. or more and 1,300° C. or less, and it is considered that the temperature is substantially same as the formation temperature of the liquid phase of a halide as the flux. Examples of the halide used include a chloride and a fluoride of a rare earth metal, an alkaline earth metal, and an alkali metal. The flux may be added as a compound having an elemental ratio of cations that provides the target composition of the resulting calcined product. The flux may be further added to the material mixture having been obtained by mixing the materials, so as to make the target composition of the resulting calcined product.

In the case where the material mixture contains a flux, the flux accelerates the reaction of the materials in the material mixture, but a too large amount thereof may cause reduction of the light emission intensity of the fluorescent material using the calcined product, and the content thereof is preferably 10% by mass or less, and more preferably 5% by mass or less, based on the material mixture.

In the calcined product having a composition shown by the formula (I), a method for producing a calcined product having a composition Sr$_{0.993}$Eu$_{0.007}$LiAl$_3$N$_4$ in terms of design composition will be described specifically below. However, the production method of the calcined product used for the nitride fluorescent material is not limited thereto.

As the metal compounds constituting the material mixture, SrN$_u$ (wherein u corresponds to ⅔, a mixture of Sr$_2$N and SrN), LiAlH$_4$, AlN, and EuF$_3$ each in the form of powder are used, and weighed to provide a ratio of Sr/Li/Eu/Al of 0.9925/1.2000/0.0075/3.0000, and mixed in a glove box in an inert atmosphere, so as to provide a material mixture. Li is mixed in a larger amount than the target composition since Li tends to fly in firing. The embodiment is not limited to the compositional ratio. In the case where a metal compound containing fluorine is used as the material, the final content of fluorine in the calcined product is preferably 5% by mass or less. In the case where the content of fluorine is larger than 5% by mass, the calcined product may be necessarily pulverized after firing, and the pulverization may deteriorate the particle shape of the calcined product.

The material mixture is fired in a nitrogen atmosphere. The firing may be performed, for example, with a gas pressurizing electric furnace. The firing temperature may be in a range of 1,000° C. or more and 1,400° C. or less, and is preferably in a range of 1,000° C. or more and 1,300° C. or less, and is more preferably in a range of 1,100° C. or more and 1,300° C. or less. When the firing temperature is too low, the target fluorescent compound may be difficult to form, and when the firing temperature is too high, the fluorescent compound may be decomposed to deteriorate the light emission characteristics.

The firing may be performed by two-step firing (or multi-step firing), in which the first step firing is performed at a temperature in a range of 800° C. or more and 1,000° C. or less, and after increasing the temperature gradually, the second step firing is performed at a temperature in a range of 1,000° C. or more and 1,400° C. or less. The firing of the material mixture may be performed by using a crucible, a boat, or the like formed of a carbonaceous material, such as graphite, boron nitride (BN), alumina ($Al_2O_3$), W, Mo, or the like.

The firing atmosphere suffices to be an atmosphere containing nitrogen gas, and may be an atmosphere containing, in addition to nitrogen gas, at least one selected from the group consisting of hydrogen, argon, carbon dioxide, carbon monoxide, ammonia. The proportion of nitrogen gas in the firing atmosphere is preferably 70% by volume or more, and more preferably 80% by volume or more.

The firing may be performed under a pressurized atmosphere in a range of 0.2 MPa or more and 200 MPa or less. While the target nitride fluorescent material tends to be decomposed at an increased temperature, the pressurized atmosphere may suppress the decomposition to facilitate the achievement of the excellent light emission characteristics. The pressurized atmosphere in terms of gauge pressure is preferably in a range of 0.2 MPa or more and 1.0 MPa or less, and more preferably in a range of 0.8 MPa or more and 1.0 MPa or less. By increasing the pressure of the atmospheric gas on firing, the fluorescent compound may be suppressed from being decomposed on firing, so as to provide a fluorescent material having high characteristics.

The firing time may be appropriately selected depending on the firing temperature, the gas composition, and other conditions. The firing time may be, for example, in a range of 0.5 hour or more and 20 hours or less, and preferably in a range of 1 hour or more and 10 hours or less.

The calcined product having a composition shown by $Sr_{0.993}Eu_{0.007}LiAl_3N_4$ is obtained through the firing. However, the composition is the theoretical composition that is expected from the mixing ratio of the material mixture, and the coefficients of the elements and the component that flies in baking, such as F, are omitted from the compositional formula. As described above, the actual composition contains a certain amount of oxygen derived from the raw materials, and oxygen formed through oxidation in the process. The actual composition also contains a certain amount of fluorine due to the use of a fluoride as a material effective as a flux component. Due to the decomposition, flying in firing, the charge composition may have smaller compositional ratios for Sr, Eu, and Li than the theoretical ratios, assuming that the charge compositional ratio of Al is 3. The composition of the target calcined product can be changed by changing the compositional ratios of the materials.

The method for producing the calcined product is not limited to the aforementioned production method. For example, the calcined product having the target composition may be obtained in such a manner that metal elemental substances of the elements are weighed to be the prescribed compositional ratio and melted to form an alloy, and then the alloy is pulverized, and treated in a nitrogen gas atmosphere with a gas pressurizing baking furnace, an HIP furnace utilizing hot isostatic pressing (HIP).

The calcined product preferably has a structure having a high crystallinity in at least a part thereof. For example, a glass material (amorphous material) has an irregular structure and a low crystallinity, and thus tends to cause chromaticity unevenness or the like unless the reaction condition in the production process thereof can be controlled to be strictly uniform. The calcined product used in the method according to the embodiment is preferably a powder material or a particle material having a structure having a high crystallinity in at least a part thereof. The calcined product that has a structure having a high crystallinity in at least a part thereof tends to be easily produced and processed. The nitride fluorescent material produced with the calcined product that has a structure having a high crystallinity in at least a part thereof can be easily dispersed uniformly in a resin, and thus light emitting plastics, a light emitting polymer thin film material, and the like can be easily prepared. Specifically, the calcined product used for the nitride fluorescent material may contain a structure having a crystallinity in an amount of, for example, 50% by mass or more, and more preferably 80% by mass or more. The value shows the ratio of the crystal phase having light emission property in the nitride fluorescent material produced with the calcined product, and the amount of the crystal phase is preferably 50% by mass or more of the calcined product since the nitride fluorescent material capable of providing practical light emission can be produced. Therefore, the nitride fluorescent material having a better light emission intensity can be obtained with the calcined product having a larger amount of the crystal phase. According to the constitution, the light emission luminance of the nitride fluorescent material can be increased, and the nitride fluorescent material can be easily processed.

Heat-Treating Calcined Product

The method for producing a nitride fluorescent material according to one embodiment of the present disclosure contains bringing the calcined product in contact with a fluorine-containing substance and heat-treating the calcined product at a temperature in a range of 200° C. or more and 500° C. or less. The calcined product mainly constitutes a florescent core of the nitride fluorescent material.

The nitride fluorescent material produced by the method according to the embodiment has a compound containing fluorine on a surface of the calcined product or in the vicinity of the surface thereof through the contact of the calcined product with a fluorine-containing substance and the heat treatment at a temperature in a range of 200° C. or more and 500° C. or less, and it is expected that the compound containing fluorine functions as a protective film. The use of the nitride fluorescent material may provide a light emitting device having excellent durability with less change in chromaticity even under an environment having relatively high temperature and humidity.

The fluorine-containing substance is not particularly limited, as long as it is a substance that contains fluorine, and examples thereof include fluorine gas ($F_2$) and fluorine compounds. Examples of the fluorine compound include $CF_4$, $CHF_3$, $NH_4HF_2$, $NH_4F$, $SiF_4$, $KrF_2$, $XeF_2$, and $NF_3$. The fluorine-containing substance is preferably at least one selected from the group consisting of $F_2$, $CHF_3$, $CF_4$, $NH_4F_2$, $NH_4F$, $SiF_4$, $KrF_2$, $XeF_2$, $XeF_4$, and $NF_3$. The fluorine-containing substance is more preferably fluorine gas ($F_2$) or ammonium fluoride ($NH_4F$).

The temperature, at which the calcined product is brought in contact with the fluorine-containing substance that is in a solid state or a liquid state at ordinary temperature, may be room temperature (20° C.±5° C.) or more and a temperature lower than the heat treatment temperature, and may be the heat treatment temperature. Specifically, the temperature may be in a range of 20° C. or more and less than 200° C., and may also be in a range of 20° C. or more and 500° C. or less. In the case where the temperature of the environment, in which the calcined product is brought in contact with the fluorine-containing substance that is in a solid state or a liquid state at ordinary temperature, is in a range of 20° C. or more and 200° C. or less, the calcined product is heat-treated at a temperature in a range of 200° C. or more and 500° C. or less after the contact of the calcined product with the fluorine-containing substance.

In the case where the fluorine-containing substance is in a solid state or a liquid state at ordinary temperature, the calcined product is preferably brought in contact with the fluorine-containing substance in an amount in a range of 1% by mass or more and 10% by mass or less based on the total amount of the calcined product and the fluorine-containing substance as 100%. The amount of the fluorine-containing substance to be brought in contact with the calcined product is more preferably in a range of 2% by mass or more and 8% by mass or less, and further preferably in a range of 3% by mass or more and 7% by mass or less, based on the total amount of the calcined product and the fluorine-containing substance as 100%. It is expected that the constitution facilitates the formation of the layer of the compound containing fluorine on the surface of the calcined product or in the vicinity of the surface thereof. In the nitride fluorescent material according to the embodiment, the layer functions as a protective layer, and thus the nitride fluorescent material mounted on a light emission device is difficult to receive the influence of the external environment, thereby enhancing the durability of the light emission device.

In the case where the fluorine-containing substance is in a gaseous state, the calcined product may be brought in contact with the fluorine-containing substance by disposing the calcined product in an atmosphere containing the fluorine-containing substance. In the case where the fluorine-containing substance is in a gaseous state, the calcined product may be disposed in an atmosphere containing the fluorine-containing substance, and the calcined product may be heat-treated in the atmosphere containing the fluorine-containing substance at a temperature in a range of 200° C. or more and 500° C. or less. In the case where the fluorine-containing substance is $F_2$ (fluorine gas), and the calcined product is heat-treated in an atmosphere containing $F_2$ at a temperature in a range of 200° C. or more and 500° C. or less, the concentration of $F_2$ in the atmosphere is preferably in a range of 2% by volume or more and 25% by volume or less, and more preferably in a range of 5% by volume or more and 20% by volume or less. The concentration of $F_2$ in the atmosphere that is less than the prescribed value may provide a possibility of failing to provide the target durability. The concentration of $F_2$ that exceeds the prescribed value may provide a possibility of fluorination of the fluorescent material core, which may significantly decrease the light emission intensity.

The heat treatment is preferably performed in an inert gas atmosphere. The inert gas atmosphere means an atmosphere that mainly contains argon, helium, nitrogen or the like as a major component in the atmosphere. The inert gas atmosphere may contain oxygen as an unavoidable impurity in some cases, and herein an atmosphere that has a concentration of oxygen contained in the atmosphere of 15% by volume or less is designated as the inert gas atmosphere. The concentration of oxygen in the inert gas atmosphere is preferably 10% by volume or less, more preferably 5% by volume or less, and further preferably 1% by volume or less. The concentration of oxygen that exceeds the prescribed value may provide a possibility of oxidizing the particles of the fluorescent material excessively. In the case where the fluorine-containing substance is in a gaseous phase, taking the safety into consideration, the heat treatment is preferably performed in an atmosphere containing an inert gas and the fluorine-containing substance rather than in an atmosphere containing the fluorine-containing substance solely.

The temperature, at which the calcined product is brought in contact with the fluorine-containing substance, and heat-treated, is in a range of 200° C. or more and 500° C. or less. The temperature for the heat treatment is more preferably in a range of 250° C. or more and 450° C. or less, further preferably in a range of 250° C. or more and 400° C. or less, and still further preferably in a range of 250° C. or more and 350° C. or less. In the case where the temperature for the heat treatment is less than the prescribed temperature, it is difficult to form the compound containing fluorine on the surface of the calcined product or in the vicinity of the surface thereof, thereby failing to provide the nitride fluorescent material having durability. In the case where the temperature for the heat treatment exceeds the prescribed temperature, it is considered that the crystal structure of the calcined product tends to be broken, thereby failing to provide the nitride fluorescent material having high durability.

The period of time for the heat treatment is not particularly limited, and is preferably in a range of 1 hour or more and 10 hours or less, and more preferably in a range of 2 hours or more and 8 hours or less. In the case where the period of time for the heat treatment is in a range of 1 hour or more and 10 hours or less, it is considered that the layer of the compound containing fluorine is formed on the surface of the calcined product or in the vicinity of the surface thereof through the contact of the calcined product with the fluorine-containing substance and the heat treatment, and the layer functions as a protective layer to enhance the durability of the light emitting device containing the fluorescent material.

Post-Process

The method for producing a nitride fluorescent material according to the embodiment may further contain, after the heat treatment, a post-process performing cracking, pulverizing, classifying, and other processing of the resulting nitride fluorescent material.

Nitride Fluorescent Material

The nitride fluorescent material according to one embodiment of the present disclosure contains a fluorescent material core having a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; N; and Si depending on necessity, and on a surface of the fluorescent material core, a layer containing a compound containing fluorine. The nitride fluorescent material according to the embodiment may contain Si as a part of Al, may contain O through oxidation of the surface thereof, may contain O by replacing a part of N, may contain F as a part of N, and may contain both O and F by replacing a part of N.

The nitride fluorescent material according to the embodiment is preferably produced by the production method according to the embodiment of the present disclosure described above. The nitride fluorescent material according to the embodiment has the aforementioned composition, and has a layer of a compound containing fluorine on the surface of the calcined product or in the vicinity of the surface thereof by bringing the calcined product preferably having the composition shown by the formula (I) in contact with the fluorine-containing substance and heat-treating the calcined product at a temperature in a range of 200° C. or more and 500° C. or less. The layer of the compound containing fluorine functions as a protective film, and thereby the interior of the nitride fluorescent material may be prevented from receiving the influence of the external environment. Due to the layer of the compound containing fluorine present on the surface of the nitride fluorescent material according to the embodiment, the elements constituting the crystal structure of the nitride fluorescent material are prevented from being reacted with carbon dioxide, water, and the like even under an environment having relatively high temperature and high humidity, and thereby the nitride fluorescent material has excellent durability. Accordingly, a light emitting device using the nitride fluorescent material according to the embodiment of the present invention has excellent durability, and can suppress the change in chromaticity, even under an environment having relatively high temperature and high humidity.

The nitride fluorescent material according to the embodiment has the fluorescent material core having the composition shown by the formula (I) and the layer of the compound containing fluorine on the surface, which is not manifested in the formula (I). In the composition shown by the formula (I), a part of N may be replaced by O, a part of N may be replaced by F, and a part of N may be replaced by both O and F, through oxidation of the surface.

$$M^a_v M^b_w M^c_x Al_{3-y} Si_y N_z \quad (I)$$

wherein $M^a$ represents at least one element selected from the group consisting of Ca, Sr, Ba, and Mg; $M^b$ represents at least one element selected from the group consisting of Li, Na, and K; $M^c$ represents at least one element selected from the group consisting of Eu, Ce, Tb, and Mn; and v, w, x, y, and z are numbers satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$, respectively.

In the formula (I), $M^a$ preferably contains at least one of Ca and Sr from the standpoint of providing a high light emission intensity. In the case where $M^a$ contains at least one of Ca and Sr, the total molar ratio of Ca and Sr contained in $M^a$ may be, for example, 85% by mol or more, and preferably 90% by mol.

$M^b$ preferably contains at least Li from the standpoint of the stability of the crystal structure. In the case where $M^b$ contains Li, the molar ratio of Li in $M^b$ may be, for example, 80% by mol or more, and preferably 90% by mol.

In the formula (I), v, w, x, y, and z are not particularly limited, as long as these numbers satisfy the aforementioned numerical value ranges. The parameter v is preferably in a range of 0.80 or more and 1.05 or less, and more preferably in a range of 0.90 or more and 1.03 or less, from the standpoint of the stability of the crystal structure. The parameter x is the activation amount of at least one element selected from the group consisting of Eu, Ce, Tb, and Mn, and may be selected appropriately to achieve the target characteristics. The parameter x preferably satisfies $0.001 < x \leq 0.020$, and more preferably satisfies $0.002 \leq x \leq 0.015$.

The nitride fluorescent material according to the embodiment preferably has a content of fluorine (F) in a range of 1.0% by mass or more and 10.0% by mass or less, more preferably in a range of 2.0% by mass or more and 8.0% by mass or less, and further preferably in a range of 2.5% by mass or more and 7.5% by mass or less.

The nitride fluorescent material according to the embodiment has the layer of the compound containing fluorine on the surface of the fluorescent material core or in the vicinity of the surface thereof. In the nitride fluorescent material according to the embodiment, it is considered that not only fluorine is present in the layer of the compound containing fluorine present on the surface of the fluorescent material or in the vicinity of the surface thereof, but also there is a possibility of the presence of fluorine in the crystal structure of the nitride fluorescent material core. The fluorine present in the crystal structure of the nitride fluorescent material core may constitute, for example, a compound containing at least one element selected from the group consisting of Ca, Sr, Ba, and Mg (i.e., the $M^a$ element), Al, oxygen (O), and fluorine (F), along with oxygen mixed in the nitride fluorescent material through oxidation thereof, the $M^a$ element, and Al, in some cases.

Figure 8:
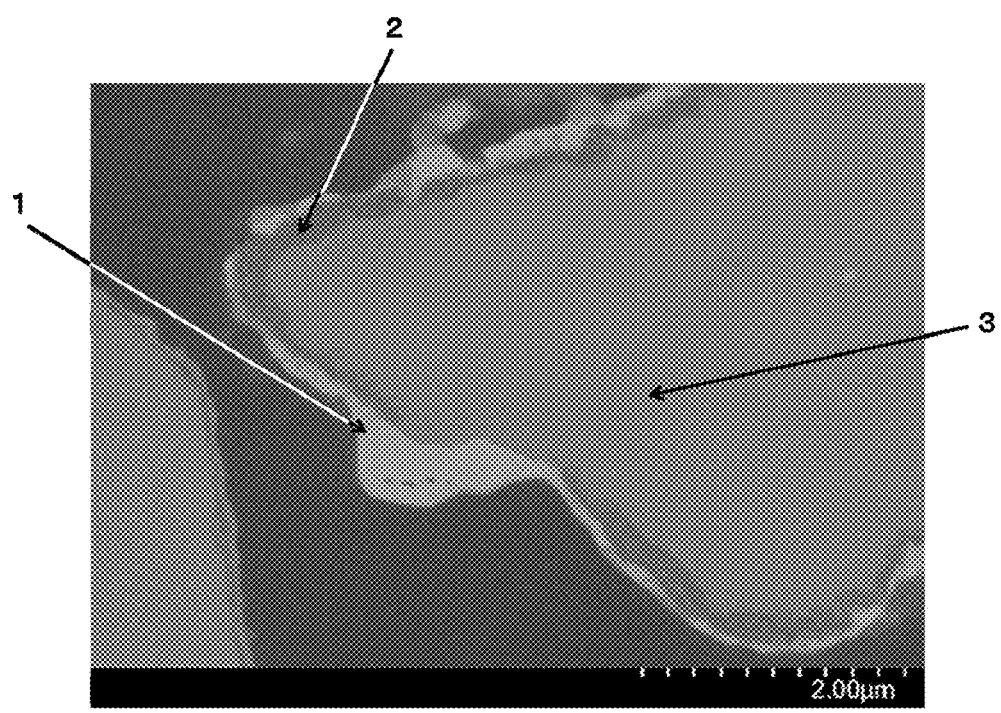
FIG. 8 is an SEM micrograph of a reflected electron image of the cross section of the another exemplary nitride fluorescent material.

The nitride fluorescent material according to the embodiment has the layer of the compound containing fluorine on the surface of the fluorescent material core or in the vicinity of the surface thereof, and the layer of the compound containing fluorine preferably has a first layer and a second layer that has a different composition from the first layer. In the nitride fluorescent material according to the embodiment, the calcined product having the aforementioned composition, and preferably the composition shown by the formula (I), may be brought in contact with the fluorine-containing substance, and heat-treated at a temperature in a range of 200° C. or less and 500° C. or more, and thereby the layer of the compound containing fluorine is formed on the surface of the calcined product or in the vicinity of the surface thereof. In the nitride fluorescent material according to the embodiment, the first layer and the second layer, which are the layers of the compound containing fluorine, can be confirmed in such a manner that as described in the examples below, the nitride fluorescent material is embedded in an epoxy resin, the epoxy resin is cured and then cut to expose the cross section of the nitride fluorescent material, and the cross section is observed with a scanning electron microscope (SEM). As shown in FIG. 8 described in the examples below, in the SEM micrograph of the reflected electron image of the cross section of the nitride fluorescent material, two layers having a difference in contrast are confirmed on the surface of the fluorescent material core constituting the nitride fluorescent material or in the vicinity of the surface thereof, in addition to the fluorescent material core.

In the nitride fluorescent material according to the embodiment, the first layer of the compound containing fluorine preferably contains at least one element selected from the group consisting of Ca, Sr, Ba, and Mg, and fluorine, and the second layer preferably contains at least one element selected from the group consisting of Ca, Sr, Ba, and Mg, Al, and fluorine.

While the mechanism of forming of the first layer and the second layer in the nitride fluorescent material according to the embodiment is not clear, it is considered that by bringing the calcined product having the aforementioned composition, and preferably the composition shown by the formula (I), in contact with the fluorine-containing substance, and heat-treating the calcined product at a temperature in a range of 200° C. or more and 500° C. or less, at least one element selected from the group consisting of Ca, Sr, Ba, and Mg constituting the skeleton of the crystal structure of the nitride fluorescent material is reacted with fluorine, so as to form the first layer containing a stable fluoride on the surface of the nitride fluorescent material. Furthermore, it is considered that by the heat treatment, depending on the oxidation state on the surface of the nitride fluorescent material and the state of the crystal structure constituting the nitride fluorescent material, such as the presence and the amount of the lattice defects, fluorine contained in the fluorine-containing substance having been brought in contact with the calcined product constituting the nitride fluorescent material is reacted in the crystal structure of the nitride fluorescent material, and thus the second layer containing at least one element selected from the group consisting of Ca, Sr, Ba, and Mg, Al, and fluorine is formed.

The second layer may contain nitrogen (N), which is an element constituting the crystal structure of the nitride fluorescent material, in addition to the at least one element selected from the group consisting of Ca, Sr, Ba, and Mg, Al, and fluorine (F).

The nitride fluorescent material according to the embodiment preferably has the first layer on the surface thereof and the second layer inside the first layer. In the nitride fluorescent material according to the embodiment, the calcined product having the aforementioned composition, and preferably the composition shown by the formula (I), is brought in contact with the fluorine-containing substance, and heat-treated at a temperature of 200° C. or more and 500° C. or less, and thereby forming the first layer containing a fluoride on the surface side, and forming the second layer inside the first layer. The nitride fluorescent material according to the embodiment preferably has, on the surface side that may be an interface in contact with the air, the first layer containing the fluoride having a stable structure containing at least one element selected from the group consisting of Ca, Sr, Ba, and Mg constituting the skeleton of the crystal structure of the nitride fluorescent material, and fluorine. The nitride fluorescent material according to the embodiment has excellent durability even under an environment having relatively high temperature and relatively high humidity, due to the presence of the first layer containing the fluoride having a stable structure on the surface thereof.

The nitride fluorescent material according to the embodiment preferably has the second layer having a different composition from the first layer inside the first layer formed on the surface side, and the second layer is preferably formed of a compound containing at least one element selected from the group consisting of Ca, Sr, Ba, and Mg constituting the skeleton of the crystal structure of the nitride fluorescent material, Al, and fluorine. The nitride fluorescent material according to the embodiment has the second layer inside the first layer, and the second layer contains the compound having a composition also containing Al constituting the crystal structure of the nitride fluorescent material. According to the constitution, it is considered that the second layer functions as a bonding layer between the first layer containing the fluoride on the surface and the crystal structure constituting the nitride fluorescent material, and the first layer on the surface of the nitride fluorescent material is more firmly bonded. The nitride fluorescent material according to the embodiment may have the stable first layer on the surface side and the second layer inside the first layer, and thereby the interior of the nitride fluorescent material is prevented from receiving the influence of the external environment, and the fluorescent material has excellent durability even under an environment having relatively high temperature and humidity.

In the case where the nitride fluorescent material according to the embodiment is produced, for example, by using the calcined product having a composition $Sr_{0.993}Eu_{0.007}LiAl_3N_4$ in terms of design composition, the layer of the compound containing fluorine is preferably formed of a compound containing Sr as an element constituting the crystal structure of the nitride fluorescent material, and fluorine. In the case where the calcined product having a composition $Sr_{0.993}Eu_{0.007}LiAl_3N_4$ in terms of design composition is used, the nitride fluorescent material according to the embodiment preferably has the first layer that is formed of a compound containing Sr and fluorine (F), and preferably has the second layer that is formed of a compound containing Sr, fluorine (F), and Al constituting the crystal structure of the nitride fluorescent material. The second layer may contain N constituting the crystal structure of the nitride fluorescent material, in addition to Sr, Al, and F.

The layer of the compound containing fluorine of the nitride fluorescent material according to the embodiment preferably has a thickness in a range of 0.05 μm or more and 0.8 μm or less, and more preferably in a range of 0.05 μm or more and 0.6 μm or less. In the case where the layer of the compound containing fluorine of the nitride fluorescent material has the first layer and the second layer, the total thickness of the first layer and the second layer is preferably in a range of 0.05 μm or more and 0.8 μm or less.

In the case where the thickness of the layer of the compound containing fluorine of the nitride fluorescent material is less than 0.05 μm, the function thereof as a protective film may be reduced due to the small thickness, and the nitride fluorescent material core tends to receive the influence of the external environment, such as the temperature and the humidity, even though the layer of the compound containing fluorine is provided, thereby providing lower durability than the nitride fluorescent material having the layer of the compound containing fluorine having a thickness of 0.05 μm or more, in some cases. In the case where the thickness of the layer of the compound containing fluorine of the nitride fluorescent material according to the embodiment exceeds 0.8 μm, the reflection of light and the like may be increased due to the large thickness of the layer of the compound containing fluorine, and the target light emission intensity cannot be obtained in some cases in the case where the nitride fluorescent material is applied to the light emission device.

In the nitride fluorescent material according to the embodiment, the thickness of the layer of the compound containing fluorine can be measured in such a manner that, as described in the examples below, the nitride fluorescent material is embedded in an epoxy resin, the epoxy resin is cured and then cut to expose the cross section of the nitride fluorescent material, the cross section is observed with a scanning electron microscope (SEM), and the thickness dimension of the layer of the compound containing fluorine is measured on the resulting image. As shown in FIG. 8 described in the examples below, in the SEM micrograph of the reflected electron image of the cross section of the nitride fluorescent material, the layer of the compound containing fluorine has an average thickness of approximately 0.1 µm. In the nitride fluorescent material according to the embodiment, the average thickness of the layer of the compound containing fluorine may be in a range of 0.05 µm or more and 0.3 µm or less.

The nitride fluorescent material according to the embodiment preferably absorbs light in a wavelength range of 400 nm or more and 570 nm or less, which is a short wavelength range of from ultraviolet ray to visible light, and preferably emits fluorescent light having a peak light emission wavelength in a wavelength range of 630 nm or more and 670 nm or less.

The light emission spectrum of the nitride fluorescent material may have a peak light emission wavelength in a range of 630 nm or more and 670 nm or less, and preferably 640 nm or more and 660 nm or less. The half bandwidth of the light emission spectrum may be, for example, 65 nm or less, preferably 60 nm or less. The lower limit of the half bandwidth may be, for example, 45 nm or more.

The nitride fluorescent material according to the embodiment contains europium (Eu), Ce, and Tb, which are rare earth elements, or Mn, which is a Group 7 element, as a center of light emission. However, the center of light emission of the nitride fluorescent material according to the embodiment is not limited to Eu, Ce, Tb, or Mn, and for example, in the case where Eu is contained, a part of Eu may be replaced by an additional element, such as another rare earth element or an alkaline earth element, and Eu and the additional element may be used as a co-activation agent. For example, $Eu^{2+}$ as a divalent rare earth ion stably exists and emits light by selecting an appropriate fluorescent material core.

The nitride fluorescent material according to the embodiment may have an average particle diameter, for example, of 4.0 µm or more, preferably 4.5 µm or more, and more preferably 5.0 µm or more, from the standpoint of the light emission intensity. The average particle diameter may be, for example, 20 µm or less, and preferably 18 µm or less. The average particle diameter of the nitride fluorescent material is the average particle diameter that includes the layer of the compound containing fluorine.

When the average particle diameter is the prescribed value or more, there is a tendency that the absorbance of the nitride fluorescent material to excitation light and the light emission intensity thereof are increased. By using the nitride fluorescent material excellent in light emission characteristics in a light emitting device described later, the luminous efficiency of the light emitting device may be enhanced. When the average particle diameter is the prescribed value or less, the workability in the production process of the light emitting device can be enhanced.

The average particle diameter of the nitride fluorescent material and the average particle diameter of the other fluorescent materials each are a volume average particle diameter, i.e., a particle diameter (median diameter) that is measured with a laser diffraction particle size distribution measuring equipment (product name: Master Sizer 2000, manufactured by Malvern Instruments, Ltd.).

Light Emitting Device

A light emitting device according to one embodiment utilizing the nitride fluorescent material according to the embodiment as a constitutional element of a wavelength conversion member will be described.

The light emitting device according to the embodiment of the present invention contains the nitride fluorescent material according to the embodiment and an excitation light source.

The excitation light source used in the light emitting device according to the embodiment is preferably an excitation light source that emits light within a wavelength range of 400 nm or more and 570 nm or less. The use of the excitation light source within the wavelength range may provide a fluorescent material having a large light emission intensity. In particular, an excitation light source having a main light emission peak wavelength in a range of 420 nm or more and 500 nm or less is more preferably used, and an excitation light source having a main light emission peak wavelength in a range of 420 nm or more and 460 nm or less is further preferably used. The use of the light emitting element having the peak light emission wavelength as the excitation light source can constitute a light emitting device that emits mixed color light of the light from the light emitting element and the fluorescent light from the fluorescent material.

The half bandwidth of the light emission spectrum of the light emitting element may be, for example, 30 nm or less. The light emitting element used is preferably a semiconductor light emitting element. The use of a semiconductor light emitting element as the light source may provide a light emitting device that has a high efficiency and a high linearity of the output with respect to the input, and is stable with high resistance to mechanical impacts. Examples of the semiconductor light emitting element include a semiconductor light emitting element using a nitride semiconductor ($In_XAl_YGa_{1-X-Y}N$, wherein X and Y satisfy $0 \leq X$, $0 \leq Y$, and $X+Y \leq 1$).

The light emitting device contains at least the nitride fluorescent material according to the embodiment. It is preferred that the nitride fluorescent material has the composition shown by the formula (I), is excited by light in a wavelength range of 400 nm or more and 570 nm or less, has a peak light emission wavelength in a wavelength range of 630 nm or more and 670 nm or less, and has a ratio of the reflectance at 650 nm and the reflectance at 460 nm of 2 or more. The details of the nitride fluorescent material have been described hereinabove, and the preferred embodiments thereof are also the same. The light emitting device preferably contains a first fluorescent material containing the nitride fluorescent material, and a second fluorescent material.

The first fluorescent material may constitute the light emitting device, for example, in such a manner that the first fluorescent material is contained in a sealing member that covers the excitation light source. In the light emitting device having the excitation light source that is covered with the sealing member containing the first fluorescent material, a part of light emitted by the excitation light source is absorbed by the first fluorescent material, and emitted as red light. The use of the excitation light source that emits light in a wavelength range of 400 nm or more and 570 nm or less may enable more effective use of the emitted light.

The content of the first fluorescent material contained in the light emitting device is not particularly limited, and may be appropriately selected depending on the final target color, and the like. For example, the content of the first fluorescent material may be in a range of 1% by mass or more and 50% by mass or less, and preferably in a range of 2% by mass or more and 30% by mass or less, based on the resin.

The light emitting device may contain a second fluorescent material that has a different peak light emission wavelength from the first fluorescent material. For example, the light emitting device may contain a light emitting element emitting blue light, and the first fluorescent material and the second fluorescent material excited by the blue light, which are appropriately selected, and thereby the light emitting device can have a wide range of color reproducibility and a high color rendering property.

Examples of the second fluorescent material include fluorescent materials each having a composition represented by any one of the following formulae (IIa) to (IIi), and at least one of fluorescent materials each having a composition represented by the formula selected from the group consisting of the formulae is preferably contained. For example, the second fluorescent material more preferably contains at least one fluorescent material having a composition shown by the formula (IIc), (IIe), and (IIi) from the standpoint of a wide range of color reproducibility provided. The second fluorescent material more preferably contains at least one fluorescent material having a composition shown by the formula (IIa), (IId), (IIf), or (IIg) from the standpoint of a high color rendering property provided.

$(Y,Gd,Tb,Lu)_3(Al,Ga)_5O_{12}:Ce$ (IIa)

$(Ba,Sr,Ca)_2SiO_4:Eu$ (IIb)

$Si_{6-p}Al_pO_pN_{8-p}:Eu$ (wherein $0<p\leq 4.2$) (IIc)

$(Ca,Sr)_8MgSi_4O_{16}(Cl,F,Br)_2:Eu$ (IId)

$(Ba,Sr,Ca)Ga_2S_4:Eu$ (IIe)

$(Ba,Sr,Ca)_2Si_5N_8:Eu$ (IIf)

$(Sr,Ca)AlSiN_3:Eu$ (IIg)

$K_2(Si,Ge,Ti)F_6:Mn$ (IIh)

$(Ba,Sr)MgAl_{10}O_{17}:Mn$ (IIi)

The second fluorescent material preferably has an average particle diameter in a range of 2 μm or more and 35 μm or less, and more preferably in a range of 5 μm or more and 30 μm or less. When the average particle size is the prescribed value or more, the light emission intensity can be further enhanced. When the average particle size is the prescribed value or less, the workability in the production process of the light emitting device can be enhanced.

The content of the second fluorescent material may be, for example, in a range of 1% by mass or more and 200% by mass or less, and preferably in a range of 2% by mass or more and 180% by mass or less, based on the resin.

The content ratio of the first fluorescent material and the second fluorescent material (first fluorescent material/second fluorescent material) may be, for example, in a range of 0.01 or more and 5.00 or less, and preferably in a range of 0.05 or more and 3.00 or less, in terms of mass ratio.

The first fluorescent material and the second fluorescent material (which may be hereinafter referred totally to as a "fluorescent material") may constitute, along with a resin, a sealing member covering the light emitting element. Examples of the resin constituting the sealing member include thermosetting resins, such as a silicone resin, an epoxy resin, an epoxy-modified silicone resin, and a modified silicone resin.

The total content of the fluorescent material in the sealing material may be, for example, in a range of 5% by mass or more and 300% by mass or less, preferably in a range of 10% by mass or more and 250% by mass or less, more preferably in a range of 15% by mass or more and 230% by mass or less, and further preferably in a range of 15% by mass or more and 200% by mass or less, based on the resin. When the content of the fluorescent material in the sealing material is in the range, the wavelength conversion of the light emitted by the light emitting element can be efficiently performed.

The sealing member may further contain a filler, a light diffusion material, and the like, in addition to the resin and the fluorescent material. The use of the light diffusion material contained may reduce the directionality of the light from the light emitting element for enhancing the viewing angle. Examples of the filler include silica, titanium oxide, zinc oxide, zirconium oxide, and alumina. In the case where the sealing member contains the filler, the content of the filler may be appropriately selected depending on the purposes and the like. The content of the filler may be, for example, in a range of 1% by mass or more and 20% by mass or less based on the resin.

One example of the light emitting device according to the embodiment will be described with reference to the drawing. FIG. 1 is a schematic cross sectional view showing an example of a light emitting device 100 according to the embodiment. The light emitting device 100 is an example of a surface mounted light emitting device.

The light emitting device 100 has a package having a recessed portion formed with lead electrodes 20 and 30 and a molded member 40, a light emitting element 10, and a fluorescent member 50 covering the light emitting element 10. The light emitting element 10 is disposed inside the recessed portion of the package, and is electrically connected to a pair of lead electrodes 20 and 30 (anode and cathode) provided on the molded member 40, with conductive wires 60 respectively. The fluorescent member 50 is filled in the recessed portion, covering the light emitting element 10 and sealing the recessed portion of the package. The fluorescent member 50 contains, for example, a fluorescent material 70 that performs wavelength conversion of light from the light emitting element 10, and a resin. The fluorescent material 70 contains a first fluorescent material 71 and a second fluorescent material 72. The pair of lead electrodes 20 and 30 each are partially exposed outside the outer side surface of the package. The light emitting device 100 emits light with electric power externally supplied through the pair of lead electrodes 20 and 30.

EXAMPLE

Some aspect of the present invention will be described more specifically with reference to examples shown below.
Production of Calcined Product A fluorescent material having a composition containing Sr, Li, Eu, Al, and N was produced. Specifically, for a fluorescent material having a composition shown by the formula (I) $M^a_v M^b_w M^c_x Al_{3-y} Si_y N_z$, wherein $M^a$ is Sr, $M^b$ is Li, and $M^c$ is Eu, $SrN_u$ (wherein u corresponds to ⅔, a mixture of $Sr_2N$ and SrN), $SrF_2$, $LiAlH_4$, AlN, and $EuF_3$ were used as materials. In this example, the parameter y in the formula (I) is 0. The materials were weighed to provide a charged molar ratio of Sr/Li/Eu/Al of 0.9925/1.2000/0.0075/3.0000 and then mixed in a glove box in an inert atmosphere, so as to provide a material mixture. The mass ratio of $SrN_u$ and $SrF_2$ was 94/6. Li (lithium) was mixed in a larger amount than the theoretical value since Li tended to fly in baking. The material mixture was charged in a crucible and heat-treated in a nitrogen gas atmosphere under a gas pressure of 0.92 MPa in terms of gauge pressure (1.02 MPa in terms of absolute pressure) at a temperature of 1,100° C. for 3 hours, so as to provide a calcined product material having a composition shown by $Sr_{0.9925}LiEu_{0.075}Al_3N_4$.

Thereafter, the calcined product was subjected to diffusion and classification, so as to provide a calcined product 1.

Example 1

The calcined product 1 was heat-treated in an atmosphere containing fluorine gas ($F_2$) and nitrogen gas ($N_2$) with a concentration of fluorine gas of 20% by volume and a concentration of nitrogen gas of 80% by volume or more at a temperature of 300° C. for a treatment time of 8 hours, so as to provide a nitride fluorescent material of Example 1 in the form of powder.

Comparative Example 1

The calcined product 1 was designated as the nitride fluorescent material of Comparative Example 1.

Example 2

A nitride fluorescent material in the form of powder was produced in the same manner as in Example 1 except that the temperature was changed to 250° C.

Example 3

A nitride fluorescent material in the form of powder was produced in the same manner as in Example 1 except that the concentration of fluorine gas was changed to 10% by volume.

Example 4

A nitride fluorescent material in the form of powder was produced in the same manner as in Example 1 except that the concentration of fluorine gas was changed to 5% by volume.

Example 5

A nitride fluorescent material in the form of powder was produced in the same manner as in Example 1 except that the temperature was changed to 350° C.

Comparative Example 2

A nitride fluorescent material in the form of powder was produced in the same manner as in Example 1 except that the temperature was changed to 30° C.

Comparative Example 3

A nitride fluorescent material in the form of powder was produced in the same manner as in Example 1 except that the temperature was changed to 150° C.

Example 6

The fluorescent material obtained in Comparative Example 2 was heat-treated in the air at a temperature of 300° C. for a treatment time of 10 hours, so as to provide a nitride fluorescent material in the form of powder.

Example 7

The fluorescent material obtained in Comparative Example 3 was heat-treated in the air at a temperature of 300° C. for a treatment time of 10 hours, so as to provide a nitride fluorescent material in the form of powder.

Example 8

The calcined product 1 was heat-treated in an atmosphere containing ammonium fluoride ($NH_4F$) added in a concentration of 5% by mass based on the total amount of the calcined product 1 and ammonium fluoride as 100% by mass and containing nitrogen gas ($N_2$) in a concentration of 90% by volume or more at a temperature of 200° C. for a treatment time of 2 hours, so as to provide a nitride fluorescent material in the form of powder.

Example 9

A nitride fluorescent material in the form of powder was produced in the same manner as in Example 8 except that the temperature was changed to 300° C.

Example 10

A nitride fluorescent material in the form of powder was produced in the same manner as in Example 9 except that the atmosphere was changed to the air.

Comparative Example 4

A nitride fluorescent material in the form of powder was produced in the same manner as in Example 8 except that the temperature was changed to 150° C.

Evaluation

X-Ray Diffraction Spectrum

Figure 2:
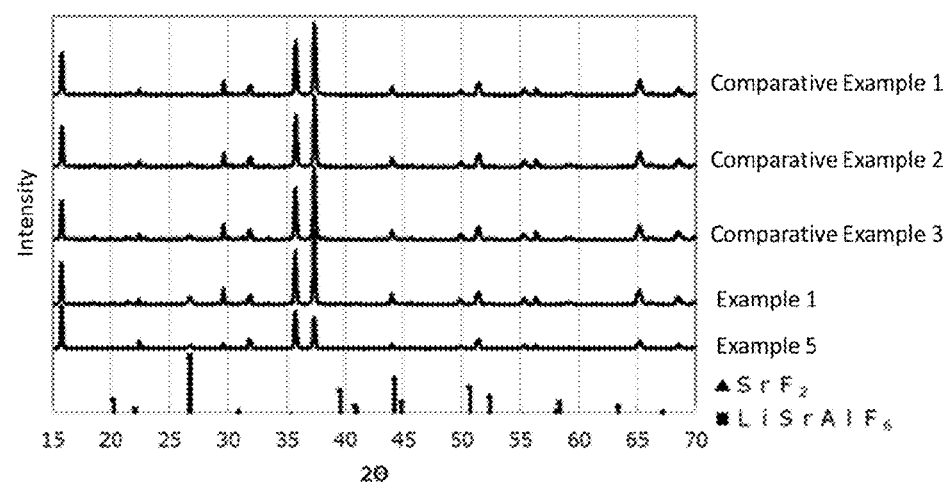
FIG. 2 is a diagram showing a comparison of X-ray diffraction patterns of exemplary nitride fluorescent materials according to the present disclosure and comparative nitride fluorescent materials, along with reference compounds.

The resulting nitride fluorescent materials were measured for X-ray diffraction (XRD) spectra. The measurement was performed with a horizontal sample mount multipurpose X-ray diffractometer (product name: Ultima IV, manufactured by Rigaku Corporation) using a CuKα line. Examples of the resulting XRD patterns are shown in FIG. 2. FIG. 2 shows the XRD patterns of the nitride fluorescent materials from Comparative Examples 1 to 3, Example 1, and Example 5 in this order from the top, and also shows the XRD patterns of $SrF_2$ and $LiSrAlF_6$ compounds for reference.

Light Emission Characteristics

Figure 3:
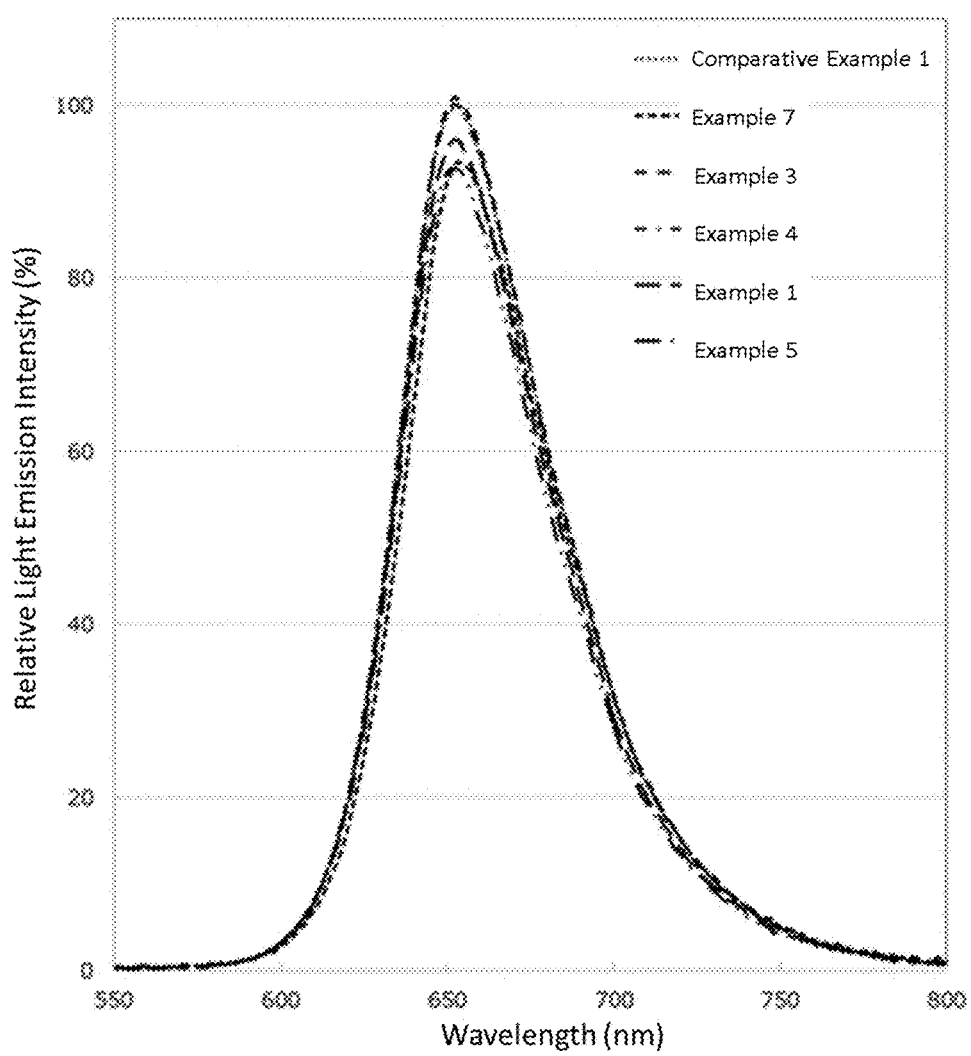
FIG. 3 is a diagram showing light emission spectra of exemplary and comparative nitride fluorescent materials.

The resulting nitride fluorescent materials were measured for light emission characteristics. The light emission characteristics of the nitride fluorescent materials were measured with a spectrofluorophotometer (product name: QE-2000, manufactured by Otsuka Electronics Co., Ltd.) with excitation light having a wavelength of 450 nm. The energy of the resulting light emission spectra (relative light emission intensity, %) was obtained. The results are shown in Table 1. The relative light emission intensity was calculated based on the nitride fluorescent material of Comparative Example 1 as 100%. The peak light emission wavelength was in a range of from 650 to 660 nm in all Comparative Examples 1 to 4 and Examples 1 to 10. FIG. 3 shows the light emission spectra showing the relative light emission intensity with respect to the wavelength of the nitride fluorescent materials of Comparative Example 1 and Examples 1, 3, 4, 5, and 7.

Compositional Analysis

The resulting nitride fluorescent materials were subjected to compositional analysis with an inductively coupled plasma emission spectrometer (manufactured by Perkin-Elmer Corporation) by the ICP emission spectrometry. In the case where the content of fluorine (F) was less than 1.0% by mass, quantitative analysis of fluorine was performed by the ion chromatography method with an ion chromatograph (ICS-1500, manufactured by Dionex), and in the case where the content of fluorine (F) was 1.0% by mass or more, quantitative analysis of fluorine was performed by the UV-VIS method with a double beam spectrophotometer (U-2900, manufactured by Hitachi, Ltd.) The contents of fluorine element in the nitride fluorescent materials thus obtained are shown in Table 1.

Storage Test

Light emitting devices were produced using the resulting nitride fluorescent materials. The nitride fluorescent materials of the above Examples and Comparative Examples each were used as the first fluorescent material, and β-SiAlON as a green fluorescent material was used as the second fluorescent material, which were dispersed in a silicone resin to form sealing materials. A nitride semiconductor light emitting element having a main wavelength of 451 nm was sealed with each of the sealing materials, so as to produce a surface mounted light emitting device having a chromaticity (x,y) around (0.25, 0.22). The light emitting device was stored at a temperature of 85° C. and a relative humidity of 85% for 100 hours, and then measured for the chromaticity x, and the change amount (absolute value) with respect to the chromaticity x before the storage test was obtained.

SEM Micrograph—Secondary Electron Image

Figure 4:
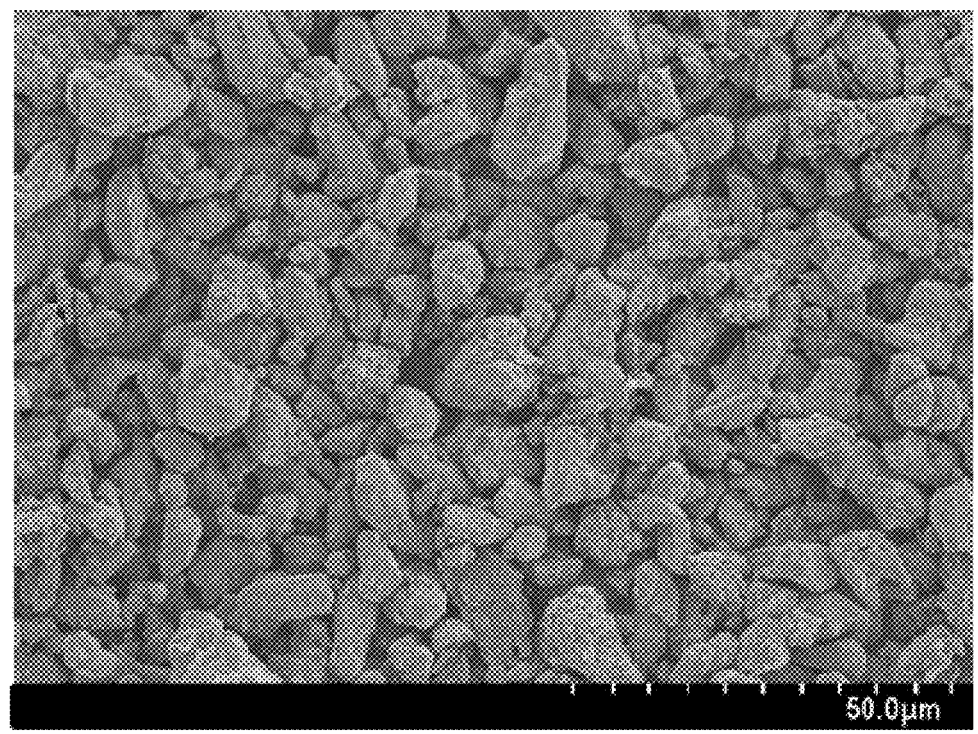
FIG. 4 is an SEM micrograph of a secondary electron image of an exemplary nitride fluorescent material.
Figure 5:
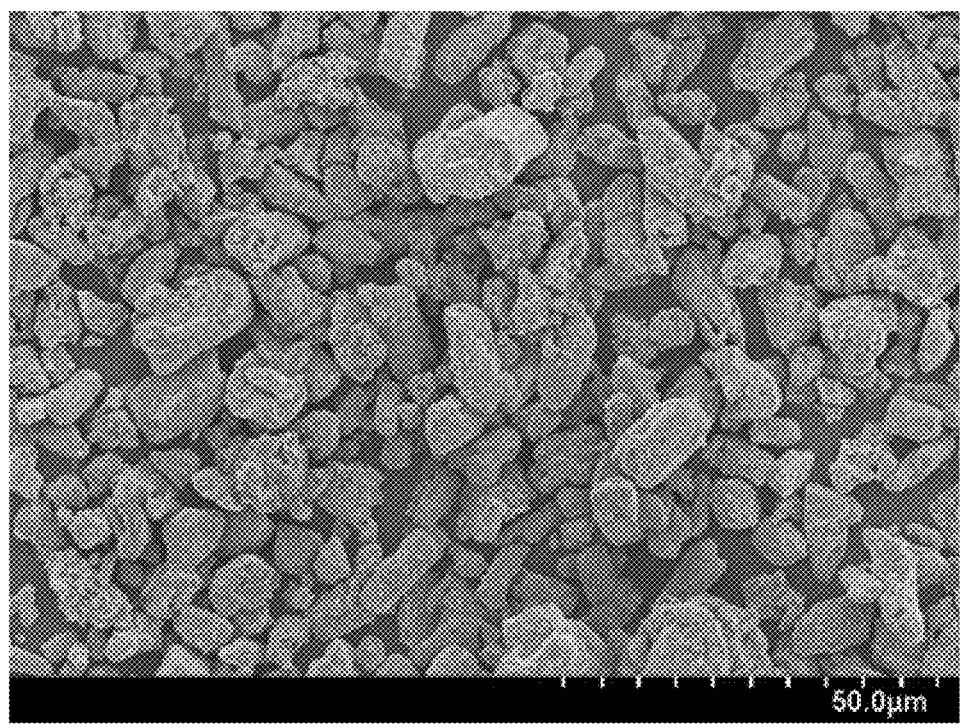
FIG. 5 is an SEM micrograph of a secondary electron image of a comparative nitride fluorescent material.
Figure 6:
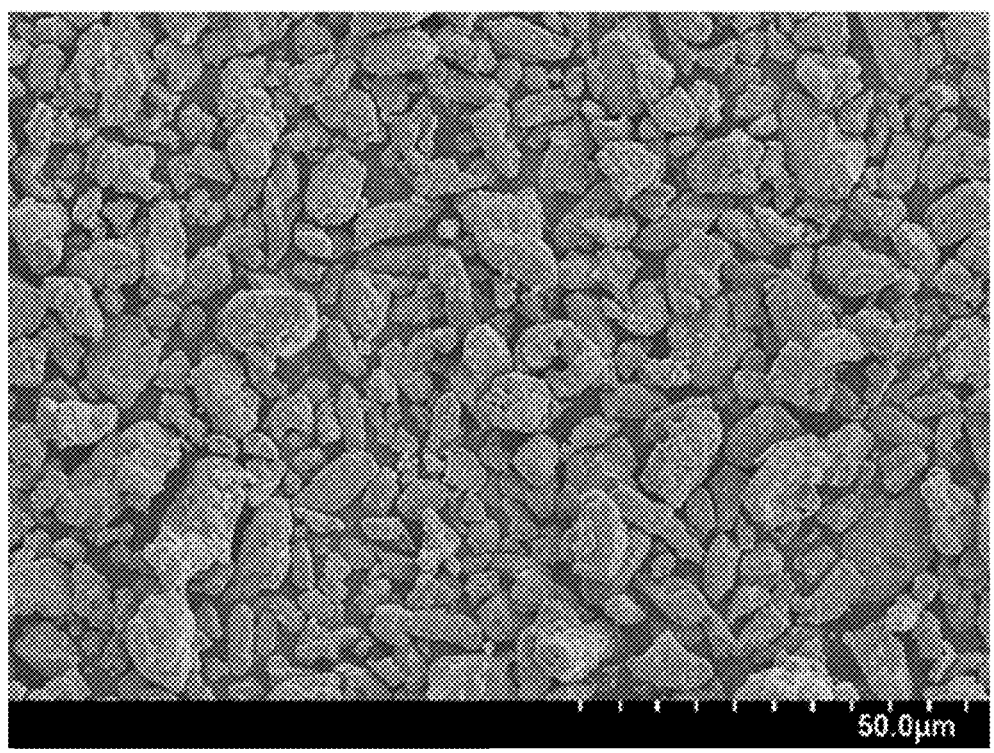
FIG. 6 is an SEM micrograph of a secondary electron image of another exemplary nitride fluorescent material.
Figure 7:
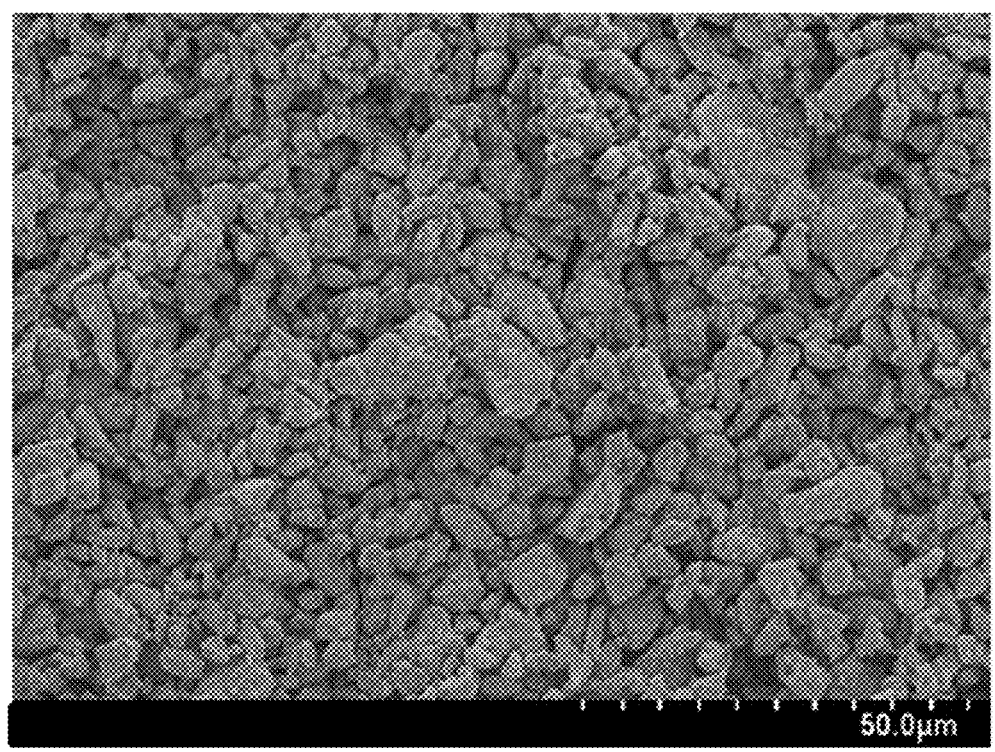
FIG. 7 is an SEM micrograph of a secondary electron image of another comparative nitride fluorescent material.

SEM micrographs of secondary electron images of the nitride fluorescent materials of Comparative Examples 1 and 3 and the nitride fluorescent materials of Examples 1 and 5 were obtained with a scanning electron microscope (SEM). FIG. 4 is the SEM micrograph of the nitride fluorescent material of Example 1, FIG. 5 is the SEM micrograph of the nitride fluorescent material of Comparative Example 1, FIG. 6 is the SEM micrograph of the nitride fluorescent material of Example 5, and FIG. 7 is the SEM micrograph of the nitride fluorescent material of Comparative Example 3.

SEM Micrograph—Reflected Electron Image

Figure 9:
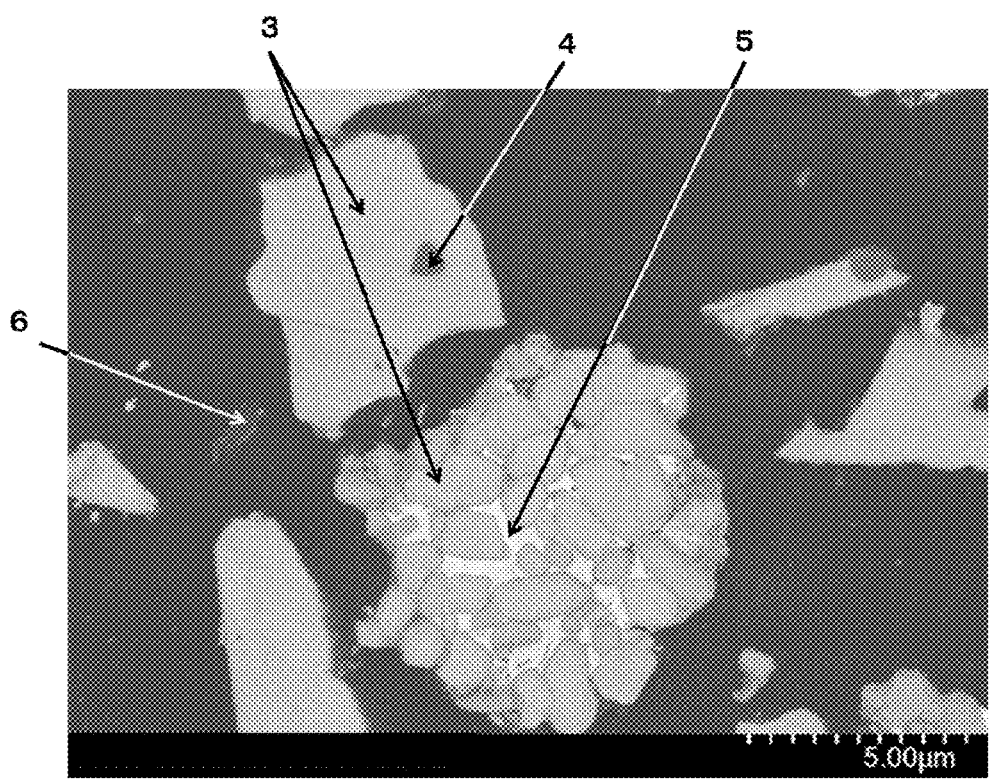
FIG. 9 is an SEM micrograph of a reflected electron image of the another comparative nitride fluorescent material.

The resulting nitride fluorescent materials were embedded in an epoxy resin, the epoxy resin was cured and then cut to expose the cross section of the nitride fluorescent material, the surface of the cross section was polished with abrasive paper and then finished with a cross section polisher (CP), and the cross section was observed with a scanning electron microscope (SEM), so as to provide SEM micrographs of reflected electron images of the cross section of the nitride fluorescent materials of Example 5 and Comparative Example 3. FIG. 8 is the SEM micrograph of the reflected electron image of the cross section of the nitride fluorescent material of Example 5, and FIG. 9 is the SEM micrograph of the reflected electron image of the cross section of the nitride fluorescent material of Comparative Example 3.

Average Particle Diameter

The resulting nitride fluorescent materials were measured for volume average particle diameter (median diameter) with a laser diffraction particle size distribution measuring equipment (product name: Master Sizer 2000, manufactured by Malvern Instruments, Ltd.), which was designated as the average particle diameter.

The contact conditions of the calcined product and the fluorine-containing substance and the heat treatment conditions in the above Examples and Comparative Examples are shown in Table 1. In Table 1, the contact conditions and the heat treatment conditions are common in Comparative Examples 2 and 3, Examples 1 to 5, Comparative Example 4, and Examples 8 and 9. In Examples 6 and 7, the conditions of the additional heat treatment performed, as well as the contact condition of the calcined product and the fluorine-containing substance, are shown in Table 1.

TABLE 1

| | Contact condition of fluorine-containing substance and heat treatment condition | | | | Additional heat treatment condition | | | Average grain diameter (μm) | Relative light emission intensity (%) | Fluorine content (% by mass) | Chromaticity x change amount |
|---|---|---|---|---|---|---|---|---|---|---|---|
| | Fluorine-containing substance | Contact temperature | Contact Atmosphere | Contact time | Temperature | Atmosphere | Time | | | | |
| Comparative Example 1 | — | — | — | — | — | — | — | 10.1 | 100 | 0.6 | 0.028 |
| Comparative Example 2 | F$_2$ | 30° C. | F$_2$: 20% by volume | 8 hours | — | — | — | 10.4 | 101 | 3.1 | 0.030 |
| Comparative Example 3 | | 150° C. | | | — | — | — | 10.2 | 100 | 7.5 | 0.026 |
| Example 1 | | 300° C. | | | — | — | — | 10.8 | 96 | 5.6 | 0.002 |
| Example 2 | | 250° C. | | | — | — | — | 10.9 | 95 | 6.1 | 0.001 |
| Example 3 | | 300° C. | F$_2$: 10% by volume | | — | — | — | 10.4 | 101 | 3.9 | 0.002 |
| Example 4 | | | F$_2$: 5% by volume | | — | — | — | 10.5 | 101 | 3.8 | 0.002 |
| Example 5 | | 350° C. | F$_2$: 20% by volume | | — | — | — | 11.3 | 93 | 6.7 | 0.000 |
| Example 6 | | 30° C. | F$_2$: 20% by volume | 8 hours | 300° C. | air | 10 hours | — | 79 | 2.6 | 0.013 |
| Example 7 | | 150° C. | | | | | | 10.1 | 93 | 7.3 | 0.002 |
| Comparative Example 4 | NH$_4$F | 150° C. | N$_2$: 90% by volume | 2 hours | — | — | — | 8.5 | 100 | 3.2 | 0.024 |
| Example 8 | | 200° C. | | | — | — | — | 11.1 | 101 | 3.1 | 0.016 |
| Example 9 | | 300° C. | | | — | — | — | 8.6 | 100 | 3.1 | 0.009 |
| Example 10 | | | air | | — | — | — | 8.5 | 102 | 3.1 | 0.016 |

Examples 1 to 5 are the cases where the calcined product is brought in contact with fluorine gas, and heat-treated in the inert gas atmosphere containing fluorine gas. Examples 6 and 7 are the cases where the calcined product is brought in contact with fluorine gas, and additionally heat-treated in the air. Examples 8 to 10 are the cases where the calcined product is brought in contact with ammonium fluoride in a solid state at ordinary temperature, and then additionally heat-treated in the air. As shown in Table 1, all the Examples showed smaller changes in chromaticity x after the storage under the aforementioned condition than Comparative Examples 1 to 4, and it was confirmed that the durability thereof was improved.

As shown in the X-ray diffraction spectra in FIG. 2, it was confirmed that the compounds of Comparative Examples 1 to 3 and Examples 1 and 5 were compounds having a composition shown by $Sr_{0.99525}LiEu_{0.075}Al_3N_4$ as in Comparative Example 1. In Examples 1 and 5, the same peaks as the peaks shown by the compounds $SrF_2$ and $LiSrAlF_6$ are found around $2\theta$ of from 25° to 27°, from which it is confirmed that fluorine element is contained. In each of the light emitting devices containing the nitride fluorescent materials from the Examples, it is considered that the layer of the compound containing fluorine formed on the calcined product constituting the fluorescent material core of the nitride fluorescent material or in the vicinity of the surface thereof functions as a protective film, and the change in chromaticity x is small under the aforementioned condition with excellent durability.

As shown in FIG. 3, the light emission spectra of the relative light emission intensity with respect to the wavelength of the nitride fluorescent materials of Examples 1, 3 to 5, and 7 show that the light emission spectrum of the nitride fluorescent material of Comparative Example 1 is substantially equally maintained, and the peak shapes of the light emission spectra of Examples are the substantially same as in Comparative Example 1, from which it is expected that the crystal structure is not changed by the heat treatment, and the crystal structure is stable.

As shown in the SEM micrograph of the secondary electron image of the nitride fluorescent material of Example 1 shown in FIG. 4 and the SEM micrograph of the secondary electron image of the nitride fluorescent material of Comparative Example 1 shown in FIG. 5, it is confirmed that there is no difference in appearance between the nitride fluorescent materials shown in the two SEM micrographs.

The SEM micrograph of the secondary electron image of the nitride fluorescent material of Example 5 shown in FIG. 6 has a less difference from the SEM micrograph of the secondary electron image of the nitride fluorescent material of Example 1 shown in FIG. 4.

As shown in the reflected electron image of the cross section of the nitride fluorescent material of Example 5 shown in FIG. 8, the nitride fluorescent material of Example 5 has the layer of the compound containing fluorine on the surface thereof.

In the SEM micrograph of the cross section of the nitride fluorescent material shown in FIG. 8, two layers having a difference in contrast can be confirmed on the surface of the fluorescent material core 3 constituting the nitride fluorescent material or in the vicinity of the surface thereof, separately from the fluorescent material core 3. As a result of the compositional analysis, the first layer 1 formed on the surface of the nitride fluorescent material was a layer formed of a compound containing Sr constituting the crystal structure of the nitride fluorescent material, and F, and the second layer 2 present inside the first layer 1 was a layer containing a compound containing Sr and Al contained in the crystal structure of the fluorescent material, and F. The compound constituting the second layer 2 further contained N, in addition to Sr, Al, and F.

In the nitride fluorescent material shown in FIG. 8, it is considered that the first layer 1 and the second layer 2 containing the compound containing fluorine function as a protective layer, with which the alkaline earth metal elements (such as an element selected from the group consisting of Ca, Sr, Ba, and Mg) and the alkali metal elements (such as an element selected from the group consisting of Li, Na, and K) constituting the nitride fluorescent material are prevented from being reacted with carbon dioxide, water, and the like in the vicinity of the surface of the nitride fluorescent material, and thus the durability is enhanced.

The total thickness of the first layer 1 and the second layer 2 is obtained from the SEM micrograph of the reflected electron image of the cross section of the nitride fluorescent material shown in FIG. 8. The average thickness of the layer of the compound containing fluorine is approximately 0.1 μm, the minimum thickness of the layer is approximately 0.05 μm, and the maximum thickness of the layer is approximately from 0.6 to 0.7 μm.

As shown in Table 1, the nitride fluorescent material of Comparative Example 1 contains fluorine element in an amount of 0.6% by mass due to the influence of the fluorine compound contained in the materials, but exhibits a larger change in chromaticity x after the storage under an environment of a temperature of 85° C. and a relative humidity of 85% than nitride fluorescent materials of the Examples, and the durability is not improved, due to the absence of the contact of the calcined product with the fluorine-containing substance and the heat treatment.

In the nitride fluorescent material of Comparative Example 2, although the calcined product is brought in contact with the fluorine-containing substance, it is considered that a layer of a compound containing fluorine is not formed on the surface of the calcined product or in the vicinity of the surface thereof due to the absence of the heat treatment, and the nitride fluorescent material exhibits a larger change in chromaticity x after the storage under the aforementioned environment.

In the nitride fluorescent materials of Comparative Examples 3 and 4, the calcined product is brought in contact with the fluorine-containing substance, and is heat-treated, but the temperature for the heat treatment is 150° C., which is lower than Examples, and it is considered that the protective film of the compound containing fluorine is not sufficiently formed. For the nitride fluorescent material of Comparative Example 3, it was confirmed from the reflected electron image of the cross section described below that a layer of a compound containing fluorine was not formed.

The SEM micrograph of the secondary electron image of the nitride fluorescent material of Comparative Example 3 shown in FIG. 7 has a less difference from the SEM micrograph of the secondary electron image of the nitride fluorescent material of Example 1 shown in FIG. 4, the SEM micrograph of the secondary electron image of the nitride fluorescent material of Comparative Example 1 shown in FIG. 5, and the SEM micrograph of the secondary electron image of the nitride fluorescent material of Example 5 shown in FIG. 6.

However, as shown in the reflected electron image of the cross section of the nitride fluorescent material of Comparative Example 3 shown in FIG. 9, a layer containing a compound containing fluorine is not confirmed on the surface of the fluorescent material core 3 of the nitride fluorescent material of Comparative Example 3 or in the vicinity of the surface thereof.

In Comparative Example 3 shown in FIG. 9, a first compound 5 containing elements constituting a nitride fluorescent material different from the fluorescent material core 3, such as Sr and fluorine (F), is formed in the particles of the nitride fluorescent material.

As shown in FIG. 9, the nitride fluorescent material may contain in some cases, in addition to the fluorescent material core 3, a compound 4 of aluminum nitride.

In FIG. 9, the numeral 6 denotes a second compound that has a different structure from the fluorescent material core 3, and contains Sr and fluorine (F), and also contains Al and oxygen (O), as a result of compositional analysis.

As shown in the results in Table 1, the nitride fluorescent materials of the embodiment retain the high light emission intensity, and are suppressed in change in chromaticity even after storing under the aforementioned environment. The nitride fluorescent materials produced by the production method according to the embodiment has excellent durability, and thus the use of the nitride fluorescent material can provide a light emitting device having high reliability.

A nitride fluorescent material having high durability can be obtained by the production method according to the present disclosure. The nitride fluorescent material according to the aspect of the present invention can be used in a light emitting device, and the light emitting device according to the present disclosure can be favorably applied to an illumination light source. In particular, the light emitting device can be favorably applied to an illumination light source significantly excellent in light emission characteristics having a light emitting diode as an excitation light source, an LED display device, a backlight source for a liquid crystal display device, a traffic signal, a lighting switch, various sensors, and various indicators.

What is claimed is:

1. A method of producing a nitride fluorescent material having a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; and N, the method comprising:
   preparing a calcined product having the composition; and
   bringing the calcined product in contact with fluorine gas and heat-treating the calcined product at a temperature in a range of 200° C. or more and 350° C. or less in an atmosphere containing fluorine gas in a range of 2% by volume to 20% by volume and nitrogen gas of 80% by volume or more.

2. The method for producing a nitride fluorescent material according to claim 1, wherein the calcined product has a composition represented by a following formula (I):

$$M^a{}_v M^b{}_w M^c{}_x Al_{3-y} Si_y N_z \qquad (I)$$

wherein $M^a$ represents at least one element selected from the group consisting of Ca, Sr, Ba, and Mg; $M^b$ represents at least one element selected from the group consisting of Li, Na, and K; $M^c$ represents at least one element selected from the group consisting of Eu, Ce, Tb, and Mn; and v, w, x, y, and z each are numbers satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$.

3. A nitride fluorescent material comprising:
   a fluorescent material core having a composition containing: at least one element selected from the group consisting of Ca, Sr, Ba, and Mg; at least one element selected from the group consisting of Li, Na, and K; at least one element selected from the group consisting of Eu, Ce, Tb, and Mn; Al; and N, and
   on a surface of the fluorescent material core, a layer containing a compound containing fluorine, wherein the layer containing the compound containing fluorine has a first layer and a second layer that has a different composition from the first layer, the first layer contains at least one element selected from the group consisting of Ca, Sr, Ba, and Mg, and fluorine, and the second layer contains at least one element selected from the group consisting of Ca, Sr, Ba, and Mg, Al, and fluorine.

4. The nitride fluorescent material according to claim 3, wherein the florescent material core further contains Si.

5. The nitride fluorescent material according to claim 4, wherein the fluorescent material core has a composition represented by a following formula (I):

$$M^a{}_v M^b{}_w M^c{}_x Al_{3-y} Si_y N_z \qquad (I)$$

wherein $M^a$ represents at least one element selected from the group consisting of Ca, Sr, Ba, and Mg; $M^b$ represents at least one element selected from the group consisting of Li, Na, and K; $M^c$ represents at least one element selected from the group consisting of Eu, Ce, Tb, and Mn; and v, w, x, y, and z each are numbers satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$, respectively.

6. The nitride fluorescent material according to claim 3, wherein the nitride fluorescent material has the first layer on a surface thereof and the second layer inside the first layer.

7. The nitride fluorescent material according to claim 3, wherein the layer containing a compound containing fluorine has a thickness in a range of 0.05 μm or more and 0.8 μm or less.

8. A light emitting device comprising the nitride fluorescent material according to claim 3, and an excitation light source.

* * * * *